United States Patent
Hong

(10) Patent No.: US 10,564,192 B2
(45) Date of Patent: Feb. 18, 2020

(54) HALL SENSOR APPARATUS WITH TEMPERATURE MEASUREMENT FUNCTION AND CURRENT SENSOR APPARATUS WITH THE SAME FUNCTION

(71) Applicant: ITX-M2M Co., Ltd., Seoul (KR)

(72) Inventor: Ki Chul Hong, Yongin-si (KR)

(73) Assignee: ITX-M2M Co., Ltd., Seoul (KR)

( * ) Notice: Subject to any disclaimer, the term of this patent is extended or adjusted under 35 U.S.C. 154(b) by 295 days.

(21) Appl. No.: 15/794,371

(22) Filed: Oct. 26, 2017

(65) Prior Publication Data
US 2019/0113550 A1   Apr. 18, 2019

(30) Foreign Application Priority Data

Oct. 12, 2017  (KR) .................... 10-2017-0132854
Oct. 12, 2017  (KR) .................... 10-2017-0132855

(51) Int. Cl.
*G01R 33/07* (2006.01)
*G01R 19/32* (2006.01)
*G01R 15/20* (2006.01)

(52) U.S. Cl.
CPC ........... *G01R 19/32* (2013.01); *G01R 15/202* (2013.01)

(58) Field of Classification Search
CPC .... G01R 33/07; G01R 33/077; G01R 33/075; G01R 33/072; G01R 15/202
See application file for complete search history.

(56) References Cited

U.S. PATENT DOCUMENTS

| 9,134,383 | B2 | 9/2015 | Fujita et al. |
| 2004/0101027 | A1* | 5/2004 | Mende .................. G01K 7/183 |
| | | | 374/152 |
| 2014/0184211 | A1 | 7/2014 | Fujita et al. |
| 2015/0142342 | A1* | 5/2015 | Huber .................. G01R 33/07 |
| | | | 702/42 |

FOREIGN PATENT DOCUMENTS

| JP | 1-105177 A | 4/1989 |
| JP | 2001-124802 A | 5/2001 |
| JP | 2009-281881 A | 12/2009 |
| JP | 4483760 B2 | 6/2010 |

(Continued)

OTHER PUBLICATIONS

Korean Notice of Allowance dated Jan. 10, 2019 in counterpart Korean Patent Application No. 10-2017-0132854 (2 pages in Korean).

(Continued)

*Primary Examiner* — Alesa Allgood
(74) *Attorney, Agent, or Firm* — NSIP Law

(57) ABSTRACT

A Hall sensor apparatus with a temperature measurement function and a current sensor apparatus with the same function are provided, and the temperature measurement function for measuring a temperature of a Hall sensor is implementable on the Hall sensor instead of an application specific integrated circuit (ASIC) that is a controller for driving the Hall sensor or a current sensor and the ASIC is installable far away from the Hall sensor, and thus a rise in temperature of the ASIC is preventable such that a stable measurement of the Hall sensor or the current sensor and stable driving control thereof is allowable.

12 Claims, 3 Drawing Sheets

(56) References Cited

FOREIGN PATENT DOCUMENTS

| | | |
|---|---|---|
| JP | 2015-83941 A | 4/2015 |
| JP | 2015-92528 A | 5/2015 |
| JP | 5997638 B2 | 9/2016 |
| KR | 10-2001-0038304 A | 5/2001 |
| KR | 10-2011-0114976 A | 10/2011 |
| KR | 10-2013-0125110 A | 11/2013 |

OTHER PUBLICATIONS

Korean Notice of Allowance dated Jan. 12, 2019 in counterpart Korean Patent Application No. 10-2017-0132855 (2 pages in Korean).

* cited by examiner

HALL SENSOR APPARATUS WITH TEMPERATURE MEASUREMENT FUNCTION AND CURRENT SENSOR APPARATUS WITH THE SAME FUNCTION

CROSS-REFERENCE TO RELATED APPLICATION(S)

This application claims priority from Korean Patent Application Nos. 10-2017-0132854 filed on Oct. 12, 2017 and 10-2017-0132855 filed on Oct. 12, 2017 in the Korean Intellectual Property Office, the disclosure of which is incorporated herein by reference in its entirety.

BACKGROUND

1. Field

The following description relates to a Hall sensor configured to output a Hall voltage due to Hall effect and a current sensor apparatus using the same.

This research (10063287) was supported by Ministry of Trade, Industry and Energy (MOTIE) and Korea Evaluation Institute of Industrial Technology (KEIT).

2. Description of Related Art

A Hall sensor is a magnetic-electro-transducer using Hall effect. A Hall voltage $V_H$ that is an output voltage of the Hall sensor is represented by the following equation.

$$V_H = \frac{R_H}{d} \cdot I_c \cdot B$$

Here, $R_H$ is a Hall coefficient, d is a thickness of a semiconductor material used as a Hall device of the Hall sensor, $I_c$ is a Hall sensor input current that is a Hall sensor driving current, and B is a magnetic flux density.

As can be seen from the equation, the Hall voltage $V_H$ that is the output voltage of the Hall sensor is proportional to the Hall coefficient $R_H$, the Hall sensor driving current $I_c$, and the magnetic flux density B, and is inversely proportional to the thickness d of the semiconductor material used as the Hall device of the Hall sensor.

Meanwhile, since the Hall sensor driving current $I_c$ is proportional to a Hall sensor driving voltage and is inversely proportional to resistance of an input terminal of the Hall sensor, and the resistance varies according to a temperature, the Hall voltage $V_H$ that is the output voltage of the Hall sensor varies according to a temperature.

This is because the resistance occurs when a defect is present in a crystalline structure, that is, impurities hindering mobility of electrons are contained in crystals, the mobility of electrons in the crystals becomes more active as a temperature becomes higher, and the number of defects is increased such that the resistance is increased.

Accordingly, there is a need to appropriately compensate for and normalize a Hall sensor output voltage according to a temperature so as to resolve a problem in that a Hall voltage that is an output voltage of a Hall sensor varies according to a temperature. As a technique to appropriately compensate for and normalize a Hall sensor output voltage according to a temperature, a temperature compensation apparatus for a Hall sensor is proposed in Korean Patent Application Publication No. 10-2011-0114976 (Oct. 20, 2011).

This technique compensates for a temperature-dependent Hall sensor output voltage by adding a compensation voltage according to a temperature to an output voltage of a static voltage source which supplies a driving current to a Hall sensor so as to compensate for the temperature-dependent Hall sensor output voltage. A temperature of the Hall sensor should be first measured to compensate for the temperature-dependent Hall sensor output voltage.

However, in the related art, since a temperature sensor for measuring the temperature of the Hall sensor is mounted inside an application specific integrated circuit (ASIC) that is a controller for driving the Hall sensor and the Hall sensor should be installed close to the ASIC, there is a problem of a rise in temperature of the ASIC.

PRIOR ART DOCUMENT

Patent Document

Korean Patent Application Publication No. 10-2011-0114976 (Oct. 20, 2011)

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The following description relates to a Hall sensor apparatus with a temperature measurement function and a current sensor apparatus with the same function, which are capable of preventing a rise in temperature of an application specific integrated circuit (ASIC) that is a controller for driving a Hall sensor and a current sensor by implementing the temperature measurement function, which measures a temperature of the Hall sensor, on the Hall sensor instead of the ASIC, thereby allowing the ASIC to be installed far away from the Hall sensor.

In one general aspect, a Hall sensor apparatus with a temperature measurement function includes a Hall device configured to output a Hall voltage due to Hall effect; a static current source configured to apply a static current to an input terminal of the Hall device; an input voltage measurer configured to measure an input voltage according to the static current applied to the input terminal of the Hall device by the static current source; an output voltage measurer configured to measure the Hall voltage that is an output voltage output from an output terminal of the Hall device; and a controller including a temperature calculator configured to calculate a temperature using the input voltage measured by the input voltage measurer, and a corrector configured to calculate a measured current from the output voltage measured by the output voltage measurer and correct the measured current according to the temperature calculated by the temperature calculator.

In another general aspect, a current sensor apparatus with a temperature measurement function includes a yoke of which both end surfaces facing each other form a gap; a Hall device installed in the gap formed by the yoke and configured to output a Hall voltage due to Hall effect; a static current source configured to apply a static current to an input terminal of the Hall device; an input voltage measurer configured to measure an input voltage according to the static current applied to the input terminal of the Hall device by the static current source; an output voltage measurer configured to measure the Hall voltage that is an output voltage output from an output terminal of the Hall device;

and a controller including a temperature calculator configured to calculate a temperature using the input voltage measured by the input voltage measurer, and a corrector configured to calculate a measured current from the output voltage measured by the output voltage measurer and correct the measured current according to the temperature calculated by the temperature calculator.

The temperature calculator may calculate resistance from the static current applied to the input terminal of the Hall device and the input voltage measured by the input voltage measurer, and may retrieve a temperature value against the calculated resistance from a lookup table.

The corrector may retrieve a current correction value against the temperature calculated by the temperature calculator from the lookup table, and reflect the current correction value against the temperature on the measured current to correct the measured current.

The controller may further include a pair of analog-to-digital (A/D) converters configured to convert an analog input voltage measured by the input voltage measurer and an analog output voltage measured by the output voltage measurer into digital values; and a pair of variable amplifiers configured to vary gains according to rated input ranges of the pair of A/D converters.

The Hall sensor apparatus with a temperature measurement function or the current sensor apparatus with the same function may directly output the analog output voltage measured by the output voltage measurer to the outside for emergency use.

The static current source may include an n-gain current mirror circuit which allows a magnitude of an output static current to be adjusted by a predetermined gain.

The controller may further include a driving current controller configured to adjust and control the magnitude of the output static current of the static current source.

Other features and aspects will be apparent from the following detailed description, the drawings, and the claims.

Figure 1:
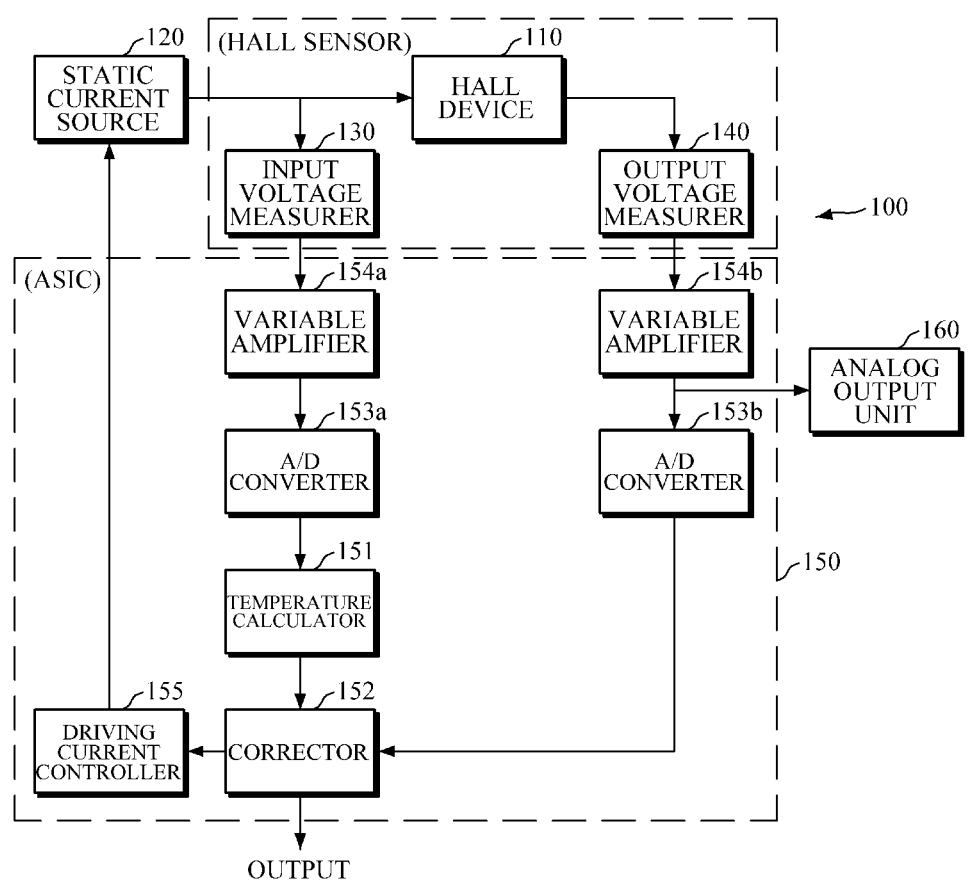
FIG. 1 is a block diagram illustrating a configuration of a Hall sensor apparatus with a temperature measurement function according to one embodiment of the present disclosure.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art.

Also, descriptions of well-known functions and constructions may be omitted for increased clarity and conciseness.

When a component is referred to as being "connected," or "coupled" to other component, it may be directly connected or coupled to the other component, but it should be understood that another components may exist between the component and the other component.

Contrarily, when a component is referred to as being "directly connected," or "directly coupled" to another component, it should be understood that other components may be absent between the component and the another component.

FIG. 1 is a block diagram illustrating a configuration of a Hall sensor apparatus with a temperature measurement function according to one embodiment of the present disclosure. As shown in FIG. 1, a Hall sensor apparatus 100 with a temperature measurement function according to the present embodiment includes a Hall device 110, a static current source 120, an input voltage measurer 130, an output voltage measurer 140, and a controller 150.

The Hall device 110 outputs a Hall voltage due to Hall effect. For example, the Hall device 110 may be modularized on an integrated circuit (IC) chip in a form in which a thin piece type of a semiconductor made of a material such as indium antimony (InSb) or gallium arsenide (GaAs) is attached to or coated on a ceramic substrate or a plastic substrate.

When a voltage is applied in a transverse direction of the Hall device 110 to cause a current to flow and a magnetic flux to pass in a direction perpendicular to the flowing direction of the current, charges are deflected sideways by a Lorentz force such that a Hall voltage is generated across both vertical ends of the Hall device 110.

At this point, since a small variation of a temperature property occurs in the Hall device 110 due to a manufacturing process but the temperature property of the Hall device 110 does not vary, a temperature of the Hall device 110 may be measured using the temperature property thereof.

The static current source 120 applies a static current to an input terminal of the Hall device 110. For example, the static current source 120 may be implemented with an n-gain current mirror circuit which allows a magnitude of an output static current to be adjusted by a predetermined gain.

Figure 3:
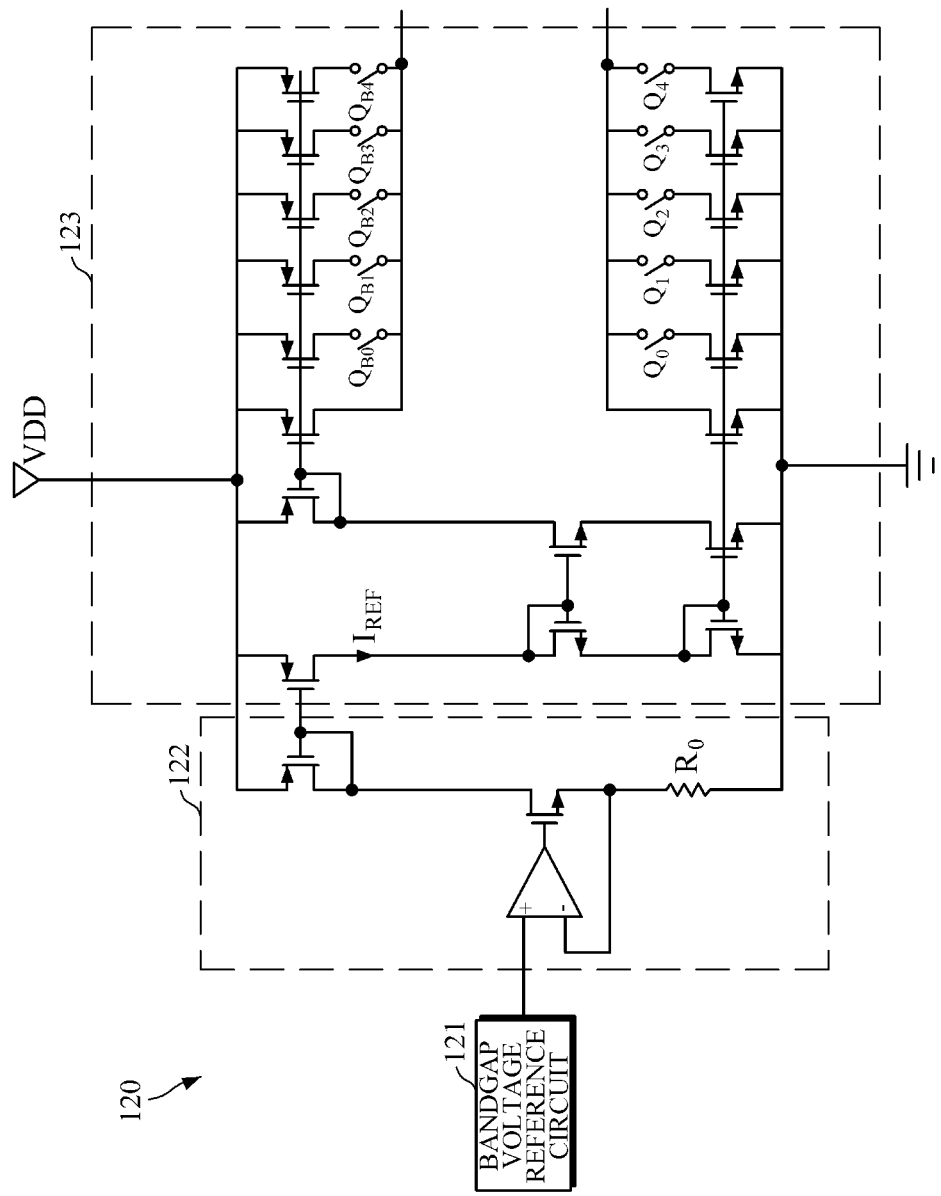
FIG. 3 is a block diagram illustrating a configuration of a static current source of the Hall sensor apparatus with a temperature measurement function or the current sensor apparatus with the same function according to one embodiment of the present disclosure.

As shown in FIG. 3, the static current source 120 includes a bandgap voltage reference circuit 121, a voltage-to-current converter 122, and a variable current amplifier 123.

The bandgap voltage reference circuit 121 outputs a constant voltage regardless of a temperature. The bandgap voltage reference circuit 121 is a known circuit that outputs a reference voltage that is independent from a temperature.

The voltage-to-current converter 122 converts the output voltage of the bandgap voltage reference circuit 121 into a constant current. The voltage-to-current converter 122 drives an input terminal of the variable current amplifier 123 by an operational (OP) amplifier and converts the reference voltage into a static current that is independent from a temperature.

The variable current amplifier 123 may be implemented with an n-gain current mirror circuit. A magnitude of an output static current of the n-gain current mirror circuit is adjusted by controlling a first analog switch array and a second analog switch array which are each connected to a plurality of transistors configuring a first output terminal and a second output terminal. The magnitude of the output static current with respect to a reference current may be controlled by an n-gain by turning on and off a single corresponding switch pair or a plurality of corresponding switch pairs between analog switch arrays $Q_{80}$ to $Q_{84}$ at the first output terminal and analog switch arrays $Q_0$ to $Q_4$ at the second output terminal.

The input voltage measurer 130 measures an input voltage according to the static current applied to the input terminal of the Hall device 110 by the static current source 120. For example, a precision voltage measuring instrument may be used as the input voltage measurer 130.

A Hall sensor output voltage should be appropriately compensated for and normalized according to a temperature so as to resolve a problem in that a Hall voltage that is an output voltage of a Hall sensor varies according to a temperature, and a temperature of the Hall sensor should be measured for the compensation and normalization.

Typically, since a temperature sensor for measuring a temperature of a Hall sensor is separately mounted inside an application specific integrated circuit (ASIC) that is a controller for driving the Hall sensor and the Hall sensor should be installed close to the ASIC, there is a problem of a rise in temperature of the ASIC that is the controller for driving the Hall sensor.

According to the present disclosure, without separately mounting a temperature sensor inside the ASIC that is the controller for driving the Hall sensor, an input voltage according to the static current applied to the input terminal of the Hall device 110 used for calculating a temperature of the Hall sensor is measured through the input voltage measurer 130.

At this point, when the input voltage measurer 130 is modularized in an IC chip in which the Hall device 110 is modularized, there is no need to mount a temperature sensor on the ASIC that is the controller for driving the Hall sensor, and thus the Hall sensor need not be installed close to the ASIC such that a problem of a rise in temperature due to installation of the Hall sensor close to the ASIC can be resolved.

The output voltage measurer 140 measures a Hall voltage that is an output voltage output from an output terminal of the Hall device 110. For example, a precision voltage measuring instrument may be used as the output voltage measurer 140. At this point, the output voltage measurer 140 can also be modularized in the IC chip in which the Hall device 110 is modularized.

The controller 150 calculates a measured current from the output voltage measured by the output voltage measurer 140 and corrects the measured current on the basis of a temperature calculated using the input voltage measured by the input voltage measurer 130.

At this point, since the controller 150 is modularized in a separate ASIC, which is spaced apart from the IC chip in which the Hall device 110 is modularized, and thus is away from the Hall sensor, a problem of a rise in temperature due to the Hall sensor may be resolved such that a stable measurement of the Hall sensor and stable driving control thereof may be possible.

The controller 150 includes a temperature calculator 151 and a corrector 152. The temperature calculator 151 calculates a temperature using the input voltage measured by the input voltage measurer 130.

At this point, the temperature calculator 151 may be implemented to calculate resistance from the static current applied to the input terminal of the Hall device 110 and the input voltage measured by the input voltage measurer 130, and may retrieve a temperature value against the calculated resistance from a lookup table, thereby calculating the temperature of the Hall sensor. The lookup table configured to store the temperature value against the resistance may be stored in a memory (not shown).

The corrector 152 calculates a measured current from the output voltage measured by the output voltage measurer 140, and corrects the measured current according to the temperature calculated by the temperature calculator 151.

At this point, the corrector 152 may be implemented to retrieve a current correction value against the temperature calculated by the temperature calculator 151 from the lookup table, and reflects the retrieved current correction value against the temperature on the measured current, thereby correcting the measured current. The lookup table configured to store the current correction value against the temperature may be stored in a memory (not shown).

According to the present disclosure implemented as described above, a temperature measurement function for measuring the temperature of the Hall sensor may be implemented on the Hall sensor instead of the ASIC that is the controller for driving the Hall sensor and the ASIC may be installed far away from the Hall sensor, and thus a rise in temperature of the ASIC may be prevented such that a stable measurement of the Hall sensor and stable driving control thereof may be possible.

In addition, according to the present disclosure, the temperature of the Hall sensor may be easily measured through the temperature measurement function implemented on the Hall sensor such that the output voltage of the Hall sensor, which is dependent on the temperature, may be easily compensated for.

Meanwhile, according to an additional aspect of the present disclosure, the controller 150 may further include a pair of analog-to-digital (A/D) converters 153a and 153b, and a pair of variable amplifiers 154a and 154b.

The pair of A/D converters 153a and 153b convert an analog input voltage measured by the input voltage measurer 130 and an analog output voltage measured by the output voltage measurer 140 into digital values.

Since the analog input voltage measured by the input voltage measurer 130 and the analog output voltage measured by the output voltage measurer 140 are converted corresponding to rated input ranges of the pair of A/D converters 153a and 153b, a precise output may be achieved by fully utilizing resolution of the pair of A/D converters 153a and 153b.

The pair of variable amplifiers 154a and 154b vary gains according to the rated input ranges of the pair of A/D converters 153a and 153b. At this point, the offsets and gains of the pair of variable amplifiers 154a and 154b may be set to values that are determined according to a characteristic of the Hall sensor and the rated input ranges of the pair of A/D converters 153a and 153b. Since the offsets and gains of the pair of variable amplifiers 154a and 154b are set according to the characteristic of the Hall sensor, a large deviation of a Hall sensor output that may be generated is eliminated.

Meanwhile, according to an additional aspect of the present disclosure, the Hall sensor apparatus 100 with a temperature measurement function may further include an analog output unit 160 configured to directly output the analog output voltage, which is output by the output voltage measurer 140, to the outside for emergency use.

Since the Hall sensor is used for a high current measurement in a current sensor or the like which senses a current for controlling a speed of an electric vehicle, the analog output voltage that is output by the output voltage measurer 140 is directly output to the outside for emergency use through the analog output unit 160, and, for example, an electronic control unit (ECU) of the electric vehicle determines whether the analog output voltage that is output through the analog output unit 160 for emergency use is greater than or equal to a reference value and, when the analog output voltage is determined to be greater than or equal to the reference value, an overvoltage is warned or a supply of power is blocked such that danger may be prevented.

Meanwhile, according to an additional aspect of the present disclosure, the controller 150 may further include a driving current controller 155. The driving current controller 155 adjusts and controls the output static current of the static current source 120.

For example, the driving current controller 155 may be implemented to control driving of the static current source 120 with a driving current value determined according to the characteristic of the Hall sensor. The static current source 120 is driven with the driving current value determined according to the characteristic of the Hall sensor by driving current controller 155 to apply the static current to the input terminal of the Hall device 110.

As described above, according to the present disclosure, the temperature measurement function for measuring the temperature of the Hall sensor can be implemented on the Hall sensor instead of the ASIC that is the controller for driving the Hall sensor and the ASIC may be installed far away from the Hall sensor, and thus a rise in temperature of the ASIC can be prevented such that a stable measurement of the Hall sensor and stable driving control thereof may be possible.

Further, according to the present disclosure, the temperature of the Hall sensor can be easily measured through the temperature measurement function implemented on the Hall sensor and the output voltage of the Hall sensor, which is dependent on a temperature, can be easily compensated for such that the above described objective of the present disclosure can be achieved.

Figure 2:
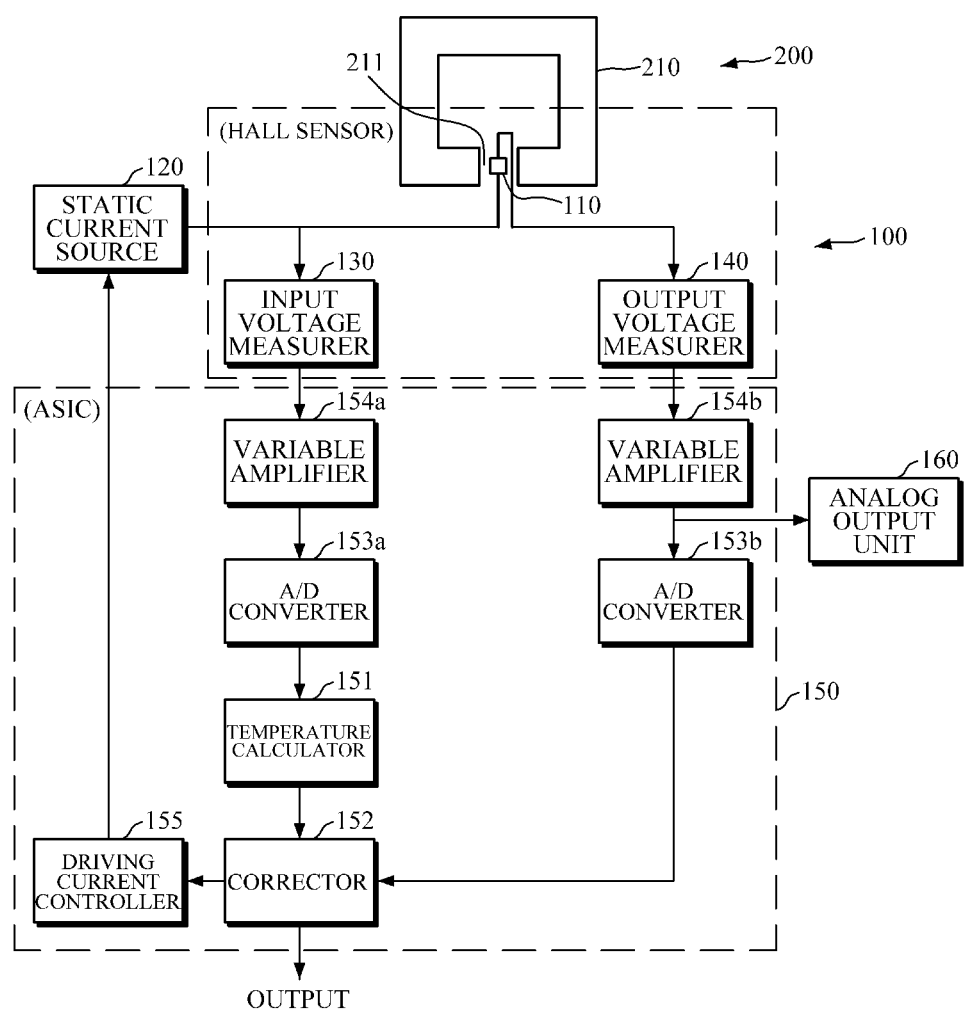
FIG. 2 is a block diagram illustrating a configuration of a current sensor apparatus with a temperature measurement function according to one embodiment of the present disclosure.

FIG. 2 is a block diagram illustrating a configuration of a current sensor apparatus with a temperature measurement function according to one embodiment of the present disclosure. As shown in FIG. 2, a current sensor apparatus 200 with a temperature measurement function according to the present embodiment includes a yoke 210 and the Hall sensor apparatus 100 shown in FIG. 1.

A gap 211 is formed by both end surfaces facing each other of the yoke 210. For example, the yoke 210 may be a stacked core in which a plurality of silicon steel plates are stacked, wherein each of the plurality of silicon steel plates is partially incised so that both end surfaces thereof face each other.

The Hall device 110 is installed in the gap 211 formed by the yoke 210 and outputs a Hall voltage due to Hall effect. For example, the Hall device 110 may be modularized in an IC chip in a form in which a thin piece type of a semiconductor made of a material such as indium antimony (InSb) or gallium arsenide (GaAs) is attached to or coated on a ceramic substrate or a plastic substrate.

When a voltage is applied in a transverse direction of the Hall device 110 to cause a current to flow and a magnetic flux to pass in a direction perpendicular to the flowing direction of the current through the yoke 210, charges are deflected sideways by a Lorentz force such that a Hall voltage is generated across both vertical ends of the Hall device 110.

At this point, since a small variation of a temperature property occurs in the Hall device 110 due to a manufacturing process but a temperature property of the Hall device 110 does not vary, a temperature of the Hall device 110 may be measured using the temperature property thereof.

The static current source 120 applies a static current to an input terminal of the Hall device 110. For example, the static current source 120 may be implemented with an n-gain current mirror circuit which allows a magnitude of an output static current to be adjusted by a predetermined gain.

As shown in FIG. 3, the static current source 120 includes the bandgap voltage reference circuit 121, the voltage-to-current converter 122, and the variable current amplifier 123.

The bandgap voltage reference circuit 121 outputs a constant voltage regardless of a temperature. The bandgap voltage reference circuit 121 is a known circuit that outputs a reference voltage that is independent from a temperature.

The voltage-to-current converter 122 converts the output voltage of the bandgap voltage reference circuit 121 into a constant current. The voltage-to-current converter 122 drives an input terminal of the variable current amplifier 123 by an operational (OP) amplifier and converts the reference voltage into a static current that is independent from a temperature.

The variable current amplifier 123 may be implemented with an n-gain current mirror circuit. A magnitude of an output static current of the n-gain current mirror circuit is adjusted by controlling a first analog switch array and a second analog switch array which are each connected to a plurality of transistors configuring a first output terminal and a second output terminal. The magnitude of the output static current with respect to a reference current may be controlled by an n-gain by turning on or off a single corresponding switch pair or a plurality of corresponding switch pairs between analog switch arrays $Q_{80}$ to $Q_{84}$ at the first output terminal and analog switch arrays $Q_0$ to $Q_4$ at the second output terminal.

The input voltage measurer 130 measures an input voltage according to the static current applied to the input terminal of the Hall device 110 by the static current source 120. For example, a precision voltage measuring instrument may be used as the input voltage measurer 130.

A Hall sensor output voltage should be appropriately compensated for and normalized according to a temperature so as to resolve a problem in which a Hall voltage that is an output voltage of a Hall sensor varies according to a temperature, and a temperature of the Hall sensor should be measured for the compensation and normalization.

Typically, since a temperature sensor for measuring a temperature of a Hall sensor is separately mounted inside an ASIC that is a controller for driving a current sensor and the Hall sensor should be installed close to the ASIC, there is a problem of a rise in temperature of the ASIC.

According to the present disclosure, without separately mounting the temperature sensor inside the ASIC that is the controller for driving the current sensor, an input voltage according to the static current applied to the input terminal of the Hall device 110 used for calculating the temperature of the Hall sensor is measured through the input voltage measurer 130.

At this point, when the input voltage measurer 130 is modularized in an IC chip in which the Hall device 110 is modularized, there is no need to mount the temperature sensor on the ASIC that is the controller for driving the current sensor, and thus the Hall sensor need not be installed close to the ASIC such that a problem of a rise in temperature due to installation of the Hall sensor close to the ASIC may be resolved.

The output voltage measurer 140 measures a Hall voltage that is an output voltage output from an output terminal of the Hall device 110. For example, a precision voltage measuring instrument may be used as the output voltage measurer 140. At this point, the output voltage measurer 140 may also be modularized in the IC chip in which the Hall device 110 is modularized.

The controller 150 calculates a measured current from the output voltage measured by the output voltage measurer 140 and corrects the measured current according to a temperature calculated using the input voltage measured by the input voltage measurer 130.

At this point, since the controller 150 is modularized in a separate ASIC, which is spaced apart from the IC chip in which the Hall device 110 is modularized, and thus is away from the Hall sensor, a problem of a rise in temperature due to the Hall sensor may be resolved such that a stable measurement of the current sensor and stable driving control thereof may be possible.

The controller 150 includes the temperature calculator 151 and the corrector 152. The temperature calculator 151 calculates a temperature using the input voltage measured by the input voltage measurer 130.

At this point, the temperature calculator 151 may be implemented to calculate resistance from the static current applied to the input terminal of the Hall device 110 and the input voltage measured by the input voltage measurer 130, and may retrieve a temperature value against the calculated resistance from a lookup table, thereby calculating the temperature of the Hall sensor. The lookup table configured to store the temperature value against the resistance may be stored in a memory (not shown).

The corrector 152 calculates a measured current from the output voltage measured by the output voltage measurer 140, and corrects the measured current according to the temperature calculated by the temperature calculator 151.

At this point, the corrector 152 may be implemented to retrieve a current correction value against the temperature calculated by the temperature calculator 151 from the lookup table, and reflects the retrieved current correction value against the temperature on the measured current, thereby correcting the measured current. The lookup table configured to store the current correction value against the temperature may be stored in a memory (not shown).

According to the present disclosure implemented as described above, a temperature measurement function for measuring the temperature of the Hall sensor may be implemented on the Hall sensor instead of the ASIC that is the controller for driving the current sensor and the ASIC may be installed far away from the Hall sensor, and thus a rise in temperature of the ASIC may be prevented such that a stable measurement of the current sensor and stable driving control thereof may be possible.

In addition, according to the present disclosure, the temperature of the Hall sensor may be easily measured through the temperature measurement function implemented on the Hall sensor provided at the current sensor such that the output voltage of the Hall sensor, which is dependent on a temperature, may be easily compensated for.

Meanwhile, according to an additional aspect of the present disclosure, the controller 150 may further include the pair of A/D converters 153a and 153b, and the pair of variable amplifiers 154a and 154b.

The pair of A/D converters 153a and 153b convert an analog input voltage measured by the input voltage measurer 130 and an analog output voltage measured by the output voltage measurer 140 into digital values, respectively.

Since the analog input voltage measured by the input voltage measurer 130 and the analog output voltage measured by the output voltage measurer 140 are converted corresponding to rated input ranges of the pair of A/D converters 153a and 153b, respectively, a precise output may be achieved by fully utilizing resolution of the pair of A/D converters 153a and 153b.

The pair of variable amplifiers 154a and 154b vary gains according to the rated input ranges of the pair of A/D converters 153a and 153b. At this point, the offsets and gains of the pair of variable amplifiers 154a and 154b may be set to values that are determined according to a characteristic of the Hall sensor and the rated input ranges of the pair of A/D converters 153a and 153b. Since the offsets and gains of the pair of variable amplifiers 154a and 154b are set according to the characteristic of the Hall sensor, a large deviation of a Hall sensor output that may be generated is eliminated.

Meanwhile, according to an additional aspect of the present disclosure, the current sensor apparatus 200 with a temperature measurement function may further include the analog output unit 160 configured to directly output the analog output voltage, which is output by the output voltage measurer 140, to the outside for emergency use.

Since the Hall sensor is used for a high current measurement in the current sensor or the like which senses a current for controlling a speed of an electric vehicle, the analog output voltage that is output by the output voltage measurer 140 is directly output to the outside for emergency use through the analog output unit 160, and, for example, an ECU of the electric vehicle determines whether the analog output voltage that is output through the analog output unit 160 for emergency use is greater than or equal to a reference value and, when the analog output voltage is determined to be greater than or equal to the reference value, an overvoltage is warned or a supply of power is blocked such that danger may be prevented.

Meanwhile, according to an additional aspect of the present disclosure, the controller 150 may further include the driving current controller 155. The driving current controller 155 adjusts and controls the output static current of the static current source 120.

For example, the driving current controller 155 may be implemented to control driving of the static current source 120 with a driving current value determined according to the characteristic of the Hall sensor. The static current source 120 is driven with the driving current value determined according to the characteristic of the Hall sensor by driving current controller 155 to apply the static current to the input terminal of the Hall device 110.

As described above, according to the present disclosure, the temperature measurement function for measuring the temperature of the Hall sensor can be implemented on the Hall sensor instead of the ASIC that is the controller for driving the current sensor and the ASIC may be installed far away from the Hall sensor, and thus a rise in temperature of the ASIC can be prevented such that a stable measurement of the current sensor and stable driving control thereof may be possible.

Further, according to the present disclosure, the temperature of the Hall sensor can be easily measured through the temperature measurement function implemented on the Hall sensor provided at the current sensor and the output voltage of the Hall sensor, which is dependent on a temperature, can be easily compensated for such that the above described objective of the present disclosure can be achieved.

At least a portion of an apparatus (for example, modules or functions thereof) or a method (for example, operations)

according to the various embodiments of the present disclosure may be implemented with instructions stored in a computer-readable storage medium in a form of a programming module.

When the instructions are executed by one or more processors, the one or more processors may perform functions corresponding to the instructions. At least a portion of the programming module stored in the computer-readable storage medium may be implemented (e.g., executed) by, for example, a processor. The at least a portion of the programming module may include, for example, modules, programs, routines, sets of instructions, or processes for performing one or more functions.

In accordance with the present disclosure, a rise in temperature of an ASIC that is a controller for driving a Hall sensor or a current sensor can be prevented by implementing a temperature measurement function, which measures a temperature of the Hall sensor, on the Hall sensor instead of an ASIC and installing the ASIC far away from the Hall sensor such that there are effects of providing a stable measurement and driving control for the Hall sensor or the current sensor having the Hall sensor.

Also, in accordance with the present disclosure, a temperature of a Hall sensor can be easily measured through a temperature measurement function implemented on the Hall sensor such that there is an effect of easily compensating for an output voltage of the Hall sensor, which is dependent on a temperature, or an output voltage of a current sensor having the Hall sensor.

It should be understood that various embodiments disclosed in the disclosure and the drawings are only illustrative of specific examples for purposes of facilitating understanding and are not intended to limit the scope of the various embodiments of the present disclosure.

Accordingly, the scope of the various embodiments of the present disclosure should be construed that all changes or modifications derived from the technical idea of the various embodiments of the present disclosure are included in the scope of the various embodiments of the present disclosure in addition to the embodiments described herein.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A Hall sensor apparatus with a temperature measurement function, comprising: a Hall device configured to output a Hall voltage due to Hall effect; a static current source configured to apply a static current to an input terminal of the Hall device; an input voltage measurer configured to measure an input voltage according to the static current applied to the input terminal of the Hall device by the static current source; an output voltage measurer configured to measure the Hall voltage that is an output voltage output from an output terminal of the Hall device; and a controller including a temperature calculator configured to calculate a temperature using the input voltage measured by the input voltage measurer, and a corrector configured to calculate a measured current from the output voltage measured by the output voltage measurer and correct the measured current according to the temperature calculated by the temperature calculator, wherein the temperature calculator calculates resistance from the static current applied to the input terminal of the Hall device and the input voltage measured by the input voltage measurer, and retrieves a temperature value against the calculated resistance from a lookup table.

2. The Hall sensor apparatus of claim 1, wherein the corrector retrieves a current correction value against the temperature calculated by the temperature calculator from a lookup table, and reflects the current correction value against the temperature on the measured current to correct the measured current.

3. The Hall sensor apparatus of claim 1, wherein the controller further includes:
a pair of analog-to-digital (A/D) converters configured to convert an analog input voltage measured by the input voltage measurer and an analog output voltage measured by the output voltage measurer into digital values; and
a pair of variable amplifiers configured to vary gains according to rated input ranges of the pair of A/D converters.

4. The Hall sensor apparatus of claim 1, further comprising an analog output unit configured to directly output an analog output voltage measured by the output voltage measurer to the outside for emergency use.

5. The Hall sensor apparatus of claim 1, wherein the static current source includes an n-gain current mirror circuit which allows a magnitude of an output static current to be adjusted by a predetermined gain.

6. The Hall sensor apparatus of claim 5, wherein the controller further includes a driving current controller configured to adjust and control the magnitude of the output static current of the static current source.

7. A current sensor apparatus with a temperature measurement function, comprising: a yoke of which both end surfaces facing each other form a gap; a Hall device installed in the gap formed by the yoke and configured to output a Hall voltage due to Hall effect; a static current source configured to apply a static current to an input terminal of the Hall device; an input voltage measurer configured to measure an input voltage according to the static current applied to the input terminal of the Hall device by the static current source; an output voltage measurer configured to measure the Hall voltage that is an output voltage output from an output terminal of the Hall device; and a controller including a temperature calculator configured to calculate a temperature using the input voltage measured by the input voltage measurer, and a corrector configured to calculate a measured current from the output voltage measured by the output voltage measurer and correct the measured current according to the temperature calculated by the temperature calculator, wherein the temperature calculator calculates resistance from the static current applied to the input terminal of the Hall device and the input voltage measured by the input voltage measurer, and retrieves a temperature value against the calculated resistance from a lookup table.

8. The current sensor apparatus of claim 7, wherein the corrector retrieves a current correction value against the temperature calculated by the temperature calculator from a lookup table, and reflects the current correction value against the temperature on the measured current to correct the measured current.

9. The current sensor apparatus of claim 7, wherein the controller further includes:
a pair of analog-to-digital (A/D) converters configured to convert an analog input voltage measured by the input voltage measurer and an analog output voltage measured by the output voltage measurer into digital values; and a pair of variable amplifiers configured to vary gains according to rated input ranges of the pair of A/D converters.

10. The current sensor apparatus of claim 7, further comprising an analog output unit configured to directly output an analog output voltage measured by the output voltage measurer to the outside for emergency use.

11. The current sensor apparatus of claim 7, wherein the static current source includes an n-gain current mirror circuit which allows a magnitude of an output static current to be adjusted by a predetermined gain.

12. The current sensor apparatus of claim 11, wherein the controller further includes a driving current controller configured to adjust and control the magnitude of the output static current of the static current source.

* * * * *